United States Patent [19]

Belcher

[11] Patent Number: 5,319,315
[45] Date of Patent: Jun. 7, 1994

[54] CLASS-C RF POWER AMPLIFIER HAVING DIGITALLY DRIVEN SHUNT CIRCUIT FOR REMOVING ACCUMULATED EXCESS BASE CHARGE

[75] Inventor: Donald K. Belcher, West Melbourne, Fla.

[73] Assignee: Harris Corporation, Melbourne, Fla.

[21] Appl. No.: 978,623

[22] Filed: Nov. 18, 1992

[51] Int. Cl.$^5$ ............................................ H03F 1/14
[52] U.S. Cl. ...................................... 330/51; 307/300
[58] Field of Search ............ 330/51, 296, 251, 207 A; 307/300

[56] References Cited

U.S. PATENT DOCUMENTS 4,808,845 2/1989 Suzuki et al. ...................... 307/300

FOREIGN PATENT DOCUMENTS 0046606 4/1980 Japan .................................. 307/300
0076906 5/1981 Japan .................................. 330/51

Primary Examiner—Steven Mottola
Assistant Examiner—J. Dudek
Attorney, Agent, or Firm—Charles Wands

[57] ABSTRACT

Analog (LC) circuit components for an input matching and base charge removal network for a Class-C amplifier are replaced by a digitally driven shunt circuit, which is coupled between the base electrode of the Class-C power transistor and a reference voltage terminal (ground). The digitally driven shunt circuit is operative to couple the base electrode of the power transistor to the reference voltage terminal upon the termination of the limited duty cycle input pulse employed as the base drive to the power amplifier. To facilitate implementation as a digital application specific integrated circuit (ASIC), the controlled shunt circuit comprises an auxiliary or second bipolar transistor having its emitter-collector path coupled in circuit with the base of the bipolar power transistor and the reference voltage terminal. This second transistor has its base coupled to receive a control pulse, which turns on the shunt transistor hard at the termination of the input pulse, thereby providing a shunt or discharge path for base charge that accumulated on the base of the power amplifier transistor during the input pulse applied to its base. Both the input pulse and the control pulse have a duration on the order of one-fourth of the duty cycle of the output voltage swing. In terms of the period of the output voltage swing, the control pulse is effectively delayed with respect to the input pulse by 90°.

9 Claims, 2 Drawing Sheets

CLASS-C RF POWER AMPLIFIER HAVING DIGITALLY DRIVEN SHUNT CIRCUIT FOR REMOVING ACCUMULATED EXCESS BASE CHARGE

FIELD OF THE INVENTION

The present invention relates in general to RF power amplifiers and is particularly directed to the use of a digitally driven shunt circuit through which base/collector junction charge of a class-C RF power amplifier transistor is controllably removed.

BACKGROUND OF THE INVENTION

FIG. 1 diagrammatically illustrates the circuit configuration of a conventional RF analog class-C power amplifier comprising a bipolar transistor 11, the base and collector terminals 13 and 15 of which are respectively coupled to associated analog matching inductance-capacitance (LC) networks or tank circuits 21 and 23 for establishing the operational parameters of the circuit. Specifically, the output or collector-connected analog (LC) network 23 is tuned to provide a resonance output voltage in response to the input sinusoidal drive. The duration of the base conduction occupies a limited portion of the output duty cycle (typically less than 180° for class-C operation), so as to minimize power consumption by power transistor 11.

As transistor 11 is driven into saturation during each cycle, input analog matching network 21 is designed to provide a path for removing or 'dumping' excess charge accumulated at the collector-base PN junction of bipolar transistor 11 due to the collector saturation effect. Since it can be expected that associated signal processing circuitry prior to the power amplifier will be digitally configured, the need to employ analog circuit components (inductors and capacitors) to implement the input matching network adds unwanted circuit complexity, size and cost to the overall power amplifier architecture.

SUMMARY OF THE INVENTION

In accordance with the present invention, conventionally employed analog circuit components for an input matching and base charge removal network are replaced by a digitally driven shunt circuit, which is coupled between the base electrode of the Class-C power transistor and a reference voltage terminal (ground). The digitally driven shunt circuit is operative to couple the base electrode of the power transistor to the reference voltage terminal upon the termination of the limited duty cycle input pulse employed as the base drive to the power amplifier. For minimal power consumption, the duration of the input current pulse to the base should be as short as possible, while still allowing a full resonance voltage output swing at the collector of the power transistor for Class-C operation. For this purpose, the duration of the input pulse is preferably on the order of one-fourth of the period of the output voltage signal.

The controlled shunt circuit comprises an auxiliary or second bipolar transistor having its emitter-collector path coupled in circuit with the base of the bipolar power transistor and the reference voltage terminal. This second transistor has its base coupled to receive a control pulse, which turns on the transistor hard at the termination of the input pulse, thereby providing, through its collector-emitter current flow path, a shunt or discharge path for base charge that accumulated on the base of the power amplifier transistor 10 during the input pulse applied to its base. Like the input pulse, the duration of the control pulse is on the order of one-fourth of the duty cycle of the output voltage swing, so that, in terms of the period of the output voltage swing, the control pulse is effectively delayed with respect to the input pulse by 90°. Advantageously, this new and improved circuit configuration facilitates implementation of the entire base drive electronics on a single chip as a digital, application specific integrated circuit (ASIC).

DETAILED DESCRIPTION

Figure 1:
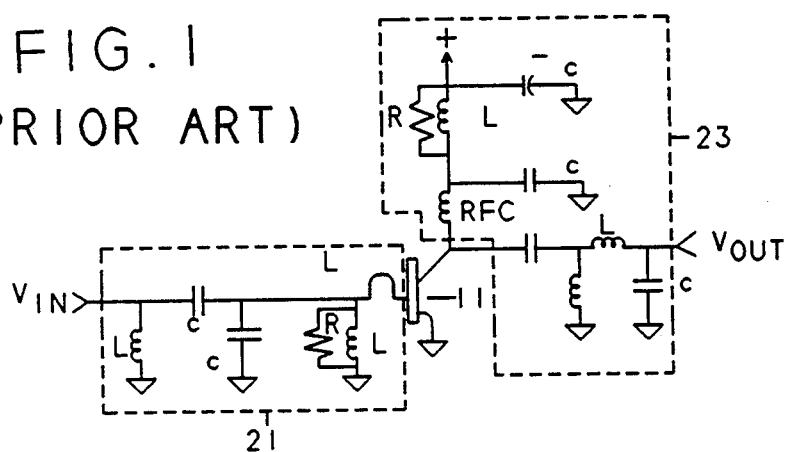
FIG. 1 diagrammatically illustrates the circuit configuration of a conventional (RF) analog class-C power amplifier comprising a bipolar transistor, the base and collector terminals of which are coupled to associated analog matching LC networks or tank circuits for establishing the operational parameters of the circuit.
Figure 2:
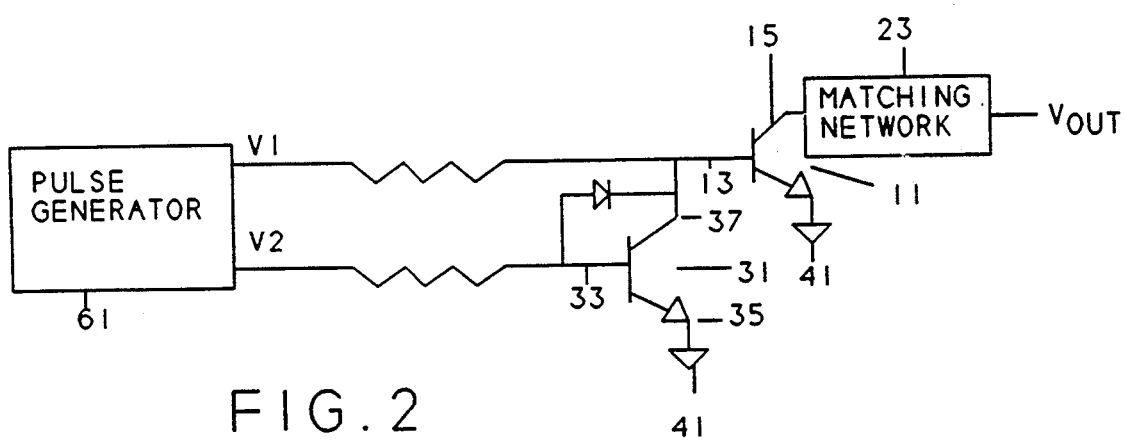
FIG. 2 diagrammatically illustrates a shunt circuit for controllably dumping the base charge of a Class-C amplifier transistor in accordance with an embodiment of the present invention.

As described supra, the present invention facilitates fabrication of upstream drive components of a Class-C amplifier by replacing conventional analog input matching and base charge removal network components by a digitally driven shunt circuit. An embodiment of such a shunt circuit is diagrammatically illustrated in FIG. 2 as comprising a second or auxiliary transistor 31, shown in the Figure as a bipolar transistor, having a base 33, an emitter 35 and a collector 37. A diode is connected between the base and collector of bipolar transistor 31. To perform the function of a base dump or discharge circuit for Class-C amplifier transistor 11, transistor 31 has its collector-emitter path coupled in series with the base 13 of transistor 11 and a ground terminal 41. Specifically the collector 37 of transistor 31 is coupled to the base electrode 13 of transistor 11, while its emitter 33 is coupled to ground terminal 41. Base electrode 33 of shunt transistor 31 is coupled to receive a limited duty cycle switching pulse upon the termination of the input pulse employed as the base drive to transistor 11.

As noted above, for minimal power consumption, the duration of the input pulse should be as short as possible, while still allowing a full resonance voltage output swing at the collector 15 of transistor 11 for Class-C operation. For this purpose, as shown at signal trace (A) in FIG. 3, the duration T51 of the input pulse signal 51 applied to the base 13 of transistor 11 is preferably on the order of one-fourth of the period T53 of the output voltage signal 53 derived from the collector 15 of transistor 11, in order to minimize power consumption by transistor 11.

Figure 3:
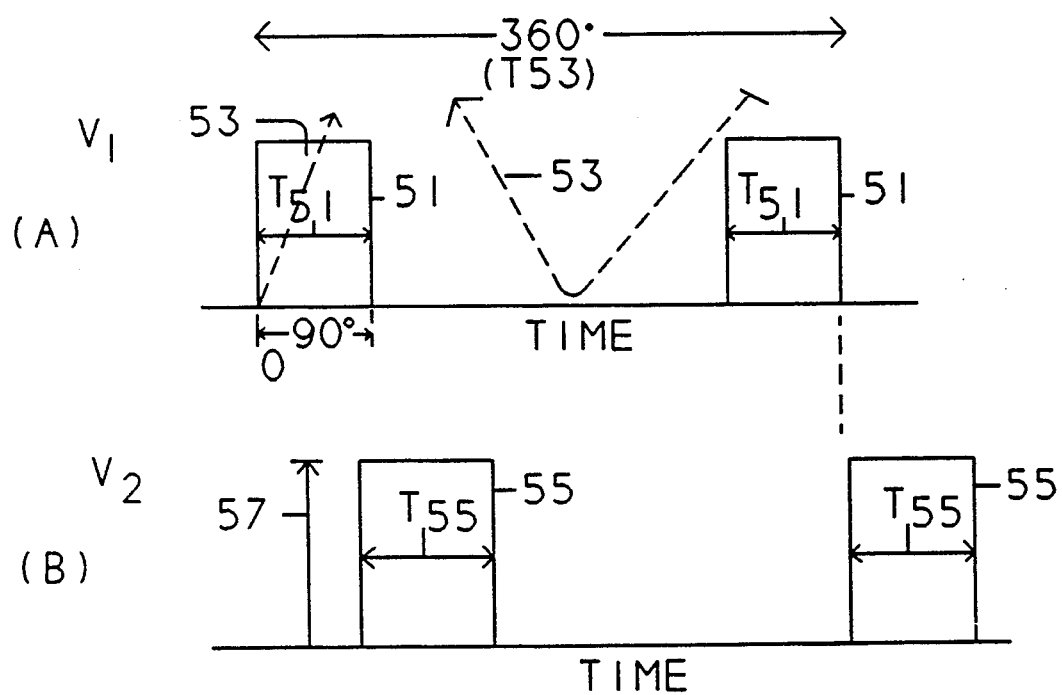
FIG. 3 is a set up timing diagrams (A) and (B) showing relationships among input pulse, Class C output voltage and the control pulse for driving the shunt circuit of FIG. 2.

The base drive signal 55 for auxiliary transistor 31 is shown as signal trace (B) in FIG. 3. This auxiliary drive signal 55 has an amplitude 57 and duration T55, such that it turns on shunt transistor 31 hard at the termination of input pulse, thereby providing a shunt or discharge path to ground for base charge that accumulated on the base 13 of transistor 11 during the input pulse applied to its base 13. Like input pulse 51, the duration T55 of the control pulse 55 is on the order of one-fourth of the duty cycle T53 of the output voltage swing, so that, in terms of the period of the output voltage swing, the control pulse is effectively delayed with respect to the input pulse by 90°.

To facilitate synchronization of the start of auxiliary drive signal 55 with the termination of input pulse 51, a phase splitter circuit 61 may be coupled to receive an input pulse signal employed as the base drive to transistor 11, such that the auxiliary drive signal is 90° delayed with respect to the input pulse. As in the case of the use of auxiliary transistor 31, digital signal processing components are preferably employed.

As will be appreciated from the foregoing description, to facilitate the use of digital application specific integrated circuit (ASIC) components for a Class-C amplifier, the present invention replaces analog circuit components conventionally employed for an input matching and base charge removal network for a Class C amplifier by a digitally driven shunt circuit, which is coupled between the base electrode of the Class-C power transistor and a reference voltage terminal. The digitally driven shunt circuit is driven by or turned-on by a control pulse which effectively matches the input pulse signal, but has a 90° delay thereby facilitating the use of digital signal processing for the entirety of the front end of the Class-C device.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A power amplifier circuit comprising:
   an input terminal to which an input pulse, the duration of which is a prescribed portion of the period of an output signal to be derived, is applied;
   an output terminal from which said output signal is derived;
   an amplifier device having an input node coupled to a first power supply terminal, an output node coupled to said output terminal, and a control node coupled to said input terminal;
   a duty cycle control circuit coupled to said output node and being operative to establish the duty cycle of operation of said power amplifier circuit; and
   a controlled switching circuit coupled between said control node and said first power supply terminal and being operative to couple said control node to said first power supply terminal in association with the termination of said input pulse, and wherein
   said amplifier device comprises a first bipolar transistor having an emitter coupled to said first power supply terminal, a collector coupled to said output terminal, and a base coupled to said input terminal, and wherein
   said controlled switching circuit comprises a second bipolar transistor having its emitter-collector path coupled in circuit with the base of said first bipolar transistor and said first power supply terminal and its base coupled to receive a control pulse.

2. A power amplifier circuit according to claim 1, wherein the duration of said input pulse is on the order of one-fourth of the period of said output signal.

3. A power amplifier circuit according to claim 1, wherein the duration of said control pulse is on the order of one-fourth of the period of said output signal.

4. A power amplifier circuit comprising:
   an input terminal to which an input pulse, the duration of which is a prescribed portion of the period of an output signal to be derived, is applied;
   an output terminal from which said output signal is derived;
   an amplifier device having an input node coupled to a first power supply terminal, an output node coupled to said output terminal, and a control node coupled to said input terminal;
   a reactive impedance network coupled to said output node and being operative to establish the mode of operation of said power amplifier circuit as Class C mode; and
   a controlled shunt circuit coupled between said control node and said first power supply terminal and being operative to couple said control node to said first power supply terminal in response to a control pulse applied thereto upon the termination of said input pulse, whereby charge accumulated at said control node is discharged through said controlled shunt circuit, and wherein
   said amplifier device comprises a first bipolar transistor having an emitter coupled to said first power supply terminal, a collector coupled to said output terminal, and a base coupled to said input terminal, and wherein
   said controlled shunt circuit comprises a second bipolar transistor having its emitter-collector path coupled in circuit with the base of said first bipolar transistor and said first power supply terminal, and its base coupled to receive said control pulse.

5. A power amplifier circuit according to claim 4, wherein the duration of each of said input pulse and said control pulse is on the order of one-fourth of the period of said output signal.

6. A power amplifier circuit comprising:
   an input terminal to which an input pulse, the duration of which is on the order of one-fourth of the period of an output signal to be derived, is applied;
   an output terminal from which said output signal is derived;
   a first bipolar transistor having an emitter coupled to a first power supply terminal, a collector coupled to said output terminal, and a base coupled to said input terminal;
   a reactive impedance network coupled to the collector of said first bipolar transistor and being operative to establish the mode of operation of said power amplifier circuit as Class C mode; and
   a controlled shunt circuit coupled between the base of said first bipolar transistor and said first power supply terminal and being operative to couple the base of said first bipolar transistor to said first power supply terminal in response to a control pulse applied thereto upon the termination of said input pulse, said controlled shunt circuit comprising a second bipolar transistor having its emitter-collector path coupled in circuit with the base of said first bipolar transistor and said first power supply terminal, and its base coupled to receive said control pulse.

7. A power amplifier circuit according to claim 6, wherein the duration of said control pulse is on the order of one-fourth of the period of said output signal.

8. For use with a power amplifier circuit having an input terminal to which an input pulse, the duration of which is a fraction of the period of an output signal to be derived, is applied, an output terminal from which said output signal is derived, a first bipolar transistor having an emitter coupled to a first power supply terminal, a collector coupled to said output terminal, and a base coupled to said input terminal, and a reactive impedance network coupled to the collector of said first bipolar transistor and being operative to establish the mode of operation of said power amplifier circuit as Class C mode, a method of removing charge accumulated at the base of said first bipolar transistor as a result of the application of said input pulse to said input terminal comprising the steps of:

(a) coupling a controlled shunt circuit between the base of said first bipolar transistor and said first power supply terminal; and (b) upon the termination of said input pulse, causing said controlled shunt circuit to provide a current flow path therethrough between the base of said first bipolar transistor and said first power supply terminal and thereby remove charge that has accumulated at the base of said first bipolar transistor, and wherein said controlled shunt circuit comprises a second bipolar transistor having its emitter-collector path coupled in circuit with the base of said first bipolar transistor and said first power supply terminal, and wherein step (b) comprises applying a control pulse to the base of said second bipolar transistor upon the termination of said input pulse.

9. The improvement according to claim 8, wherein the duration of said each of said input pulse and said control pulse is on the order of one-fourth of the period of said output signal.

* * * * *